(12) United States Patent
Westby

(10) Patent No.: US 7,064,683 B1
(45) Date of Patent: Jun. 20, 2006

(54) SPEED OPTIMIZED ENCODER WITH RUNNING DISPARITY CONSTRAINT

(75) Inventor: Judy L. Westby, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/038,653

(22) Filed: Jan. 19, 2005

(51) Int. Cl.
H03M 7/00 (2006.01)

(52) U.S. Cl. .......................................... 341/50; 341/55
(58) Field of Classification Search ............. 341/50–70
See application file for complete search history.

(56) References Cited

U.S. PATENT DOCUMENTS

| | | | |
|---|---|---|---|
| 4,486,739 A | 12/1984 | Franaszek et al. | 340/347 |
| 4,619,425 A | 10/1986 | Nagel | 246/34 |
| 4,974,115 A | 11/1990 | Breidegam et al. | 361/231 |
| 5,663,724 A | 9/1997 | Westby | 341/59 |
| 6,016,330 A | 1/2000 | Ashley et al. | 375/341 |
| 6,198,413 B1 | 3/2001 | Widmer | 341/59 |
| 6,295,010 B1 * | 9/2001 | Thiesfeld | 341/59 |

* cited by examiner

*Primary Examiner*—Lam T. Mai
(74) *Attorney, Agent, or Firm*—Westman, Champlin & Kelly

(57) ABSTRACT

An encoder apparatus is provided, which includes an upper encoder and first and second lower encoders. The upper encoder has an upper encoded output and a corresponding upper running disparity. The first and second lower encoders have respective first and second lower encoded outputs. The first lower encoder generates the first lower encoded output assuming the upper running disparity has a first state. The second lower encoder generates the second lower encoded output assuming the upper running disparity has a second, different state. A multiplexer multiplexes the first and second lower encoded outputs based on the upper running disparity.

15 Claims, 3 Drawing Sheets

SPEED OPTIMIZED ENCODER WITH RUNNING DISPARITY CONSTRAINT

FIELD OF THE INVENTION

The present invention relates to data encoding and decoding and in particular relates to encoders and decoders that constrain the running disparity in symbols generated by the code.

BACKGROUND OF THE INVENTION

Data encoding schemes are commonly used in serial interfaces, such as a Fiber Channel Arbitrated Loop (FCAL), a Serial Attached Small Computer Standard Interface (SCSI), and a serial ATA (SATA) interface. Many different encoding schemes and codes can be used. One common code used for serial interfaces is a byte-oriented DC-balanced (0,4) run length limited, rate 8B/10B partitioned block transmission code. One form of an 8B/10B encoder/decoder is described in U.S. Pat. No. 4,486,739 granted Dec. 4, 1984 for "Byte Oriented DC Balanced (0,4) 8B/10B Partitioned Block Transmission Code" by Franaszek et al. The Franaszek 8B/10B encoder/decoder partitions an 8-bit input word into a 5-bit portion and a 3-bit portion. The 5-bit portion is encoded to a 6-bit output, and the 3-bit portion is encoded with a control bit to a 4-bit output.

Run length is defined as the number of identical contiguous symbols (ones or zeros) that appear in a data stream. A large number of contiguous binary ones will produce a highly positive DC signal, whereas a large number of contiguous binary zeros will produce a highly negative DC signal. However, it is important to maintain DC balance in the signal, both in long data strings as well as short data strings. Thus, on a (0,4) code, a symbol is followed by no more than four contiguous identical symbols (meaning a data stream may contain a string of up to five identical symbols before one of opposite value). The "0" in the (0,4) notation means that a symbol may be followed by no less than zero contiguous identical symbols—meaning that any given symbol may be followed by a symbol of same or opposite value. The (0,4) code disclosed in the Franaszek et al. patent permits only four characters that might generate five identical contiguous symbols, three of those characters being special characters. Hence, except for those four characters, the (0,4) code disclosed in the Franaszek et al. patent is effectively a (0,3) code.

The disparity of a block of data is the difference between the numbers of ones and zeros in the block. To adjust the DC level of the output string, the Franaszek et al. apparatus compares the running disparity from prior words to the disparity of the current word portion being encoded. The encoder then produces the output word portion, or a complement thereof. For example, if the running disparity is +1 and the current output word portion has a disparity of +2, the output portion is complemented to a word portion with a disparity of −2 and a −1 disparity is passed to the next encoding stage. The maximum disparity possible in the Franaszek et al. scheme is +3 and −3, and the disparity at the bounds between the 6-bit output and 4-bit output portions is either +1 or −1. Since the Franaszek et al. encoder is designed so a zero disparity is not possible, the disparity at the bounds between the 6-bit and 4-bit portions is at the minimum values of ±1.

In the Franaszek et al. scheme, the running disparity is passed from one encoding stage to the next, so that the running disparity from the 5B/6B encoder stage is held to encode the 3-bit input portion for the same word in the 3B/4B stage, and the running disparity from the 3B/4B encoder stage is held to encode the 5-bit input portion of the next word in the 5B/6B encoder stage. The holding of the running disparity between the stages required the two encoder stages be operated during different portions of the clock cycle. The output registers therefore are operated on separate portions of the clock.

To achieve wider data paths, a parallel version of the Franaszek 8B/10B encoder was implemented. In the parallel version, one of two 8B/10B encoders encoded the upper half of a 16-bit input word while the other 8B/10B encoder encoded the lower half of the 16-bit word. The disparity was passed in sequence so that the running disparity of the upper 6-bit word portion was passed to the upper 3B/4B encoder, the running disparity of the upper 4-bit word portion was passed to the lower 5B/6B encoder, the running disparity of the lower 6-bit word portion was passed to the lower 3B/4B encoder, and the running disparity of the lower 4-bit word portion was passed to the upper 5B/6B encoder for the next word. To avoid holding each of the running disparities one-half cycle as in the original Franaszek et al. design, the parallel design operated the encoders and buffers on the same clock cycle and held the running disparity of the lower 4-bit word portion for later encoding in the upper 5B/6B encoder. The disparity of the upper 6-bit word portion was combinationally passed to the upper 3B/4B encoder, the disparity of the upper 4-bit word portion was combinationally passed to the lower 5B/6B encoder, and the disparity of the lower 6-bit word portion was combinationally passed to the upper 3B/4B encoder. Hence, during a single clock cycle, the running disparity of the second 4-bit output sub-block of a previous word is combined with the disparity of the current first 6-bit output sub-block and the running disparity of both current 6-bit output sub-blocks and the current first 4-bit output sub-block are combined with the disparities of both current 4-bit output sub-blocks and the current second 6-bit output sub-block, thereby selectively complementing all output sub-blocks for a current data block during a single clock cycle.

U.S. Pat. No. 5,663,724 discloses a binary encoding apparatus for producing a DC balanced run length limited rate 16B/20B code from an unconstrained input data stream that includes consecutive 16-bit data blocks. The encoding apparatus includes a pair of parallel 8B/10B encoders each having a 5B/6B and a 3B/4B encoder portion responsive to respective 5-bit and 3-bit sub-blocks to produce respective 6-bit and 4-bit output sub-blocks. Each encoder portion is responsive to the disparity of its current output sub-block and a running disparity associated with another sub-block to selectively complement the bits of its sub-block to reduce running disparity. The encoder further includes disparity processing means for combinationally passing the running disparity of each 6-bit output sub-block to the 3B/4B encoder of the associated 8B/10B encoder and the running disparity of the 4-bit output sub-block associated with a first of the 8B/10B encoders to the 5B/6B encoder of a second of the 8B/10B encoders, thereby selectively complementing the 4-bit output sub-blocks and the 6-bit output sub-block associated with the second 8B/10B encoder for a current data block. The disparity processing means additionally holds and processes the running disparity of the 4-bit output sub-block associated with the second 8B/10B encoder to the 5B/6B encoder of the first 8B/10B encoder, thereby selectively complementing the 6-bit output sub-block associated with the first 8B/10B encoder for the next data block. In one embodiment, the encoder apparatus further implements a forced disparity control. The forced disparity control responds to a special character bit and a forced disparity bit to force the running disparity of the 5B/6B encoder of the first, upper encoder to a selected polarity. The forced disparity control also passes the running disparity of the selected polarity of the immediately prior 4-bit output sub-block of the second, lower 8B/10B encoder to the 5B/6B encoder of the first 8B/10B encoder.

The 8B/10B encoders and decoders described above are highly combinational circuits with many levels of logic. The serial interfaces in which these encoders and decoders are used continue to support higher and higher interface speeds over time. As the interface speeds increase, it is becoming more difficult to meet timing margins in the integrated circuits that implement the serial interface logic.

In the 8B/10B encoding schemes discussed above, the running disparity from the upper 8B/10B encoder is calculated and passed combinationally to the lower 8B/10B encoder. The running disparity from the upper 8B/10B encoder is required before the lower 8B/10B encoder can evaluate its 10-bit output. The combinational path from the upper encoder to the lower encoder is becoming increasing more difficult to evaluate in a single clock cycle as the interface speeds increase with the integrated circuit technologies available today.

The conventional approach of increasing bandwidth through the encoder by widening the encoder from an 8B/10B encoding scheme to a 32B/40B encoding scheme and running the encoder at a high clock speed does not solve the problem. There is still a serial path from the uppermost 8B/10B encoder through the middle 8B/10B encoders to the lowermost 8B/10B encoder.

Improved encoders and encoding schemes are therefore desired for codes, such as 8B/10B codes, that constrain the running disparity in symbols produced by the code.

SUMMARY OF THE INVENTION

An embodiment of the present invention is directed to an encoder apparatus, which includes an upper encoder and first and second lower encoders. The upper encoder has an upper encoded output and a corresponding upper running disparity. The first and second lower encoders have respective first and second lower encoded outputs. The first lower encoder generates the first lower encoded output assuming the upper running disparity has a first state. The second lower encoder generates the second lower encoded output assuming the upper running disparity has a second, different state. A multiplexer multiplexes the first and second lower encoded outputs based on the upper running disparity.

Another embodiment of the present invention is directed to a method of encoding an input data stream. The method includes: (a) dividing a portion of the input data stream into first and second blocks; (b) encoding the first block into an upper encoded block and generating a corresponding upper running disparity; (c) encoding the second block into a first lower encoded block assuming the upper running disparity has a first state; (d) encoding the second block into a second lower encoded block, in parallel with step (c), assuming the upper running disparity has a second, different state; and (e) multiplexing the first and second lower encoded outputs based on the upper running disparity.

Another embodiment of the present invention is directed to a decoder apparatus, which includes an upper decoder and first and second lower decoders. The upper decoder has an upper decoded output and a corresponding upper running disparity. The first and second lower decoders have respective first and second lower decoded outputs. The first lower decoder generates the first lower decoded output assuming the upper running disparity has a first state. The second lower decoder generates the second lower decoded output assuming the upper running disparity has a second, different state. A multiplexer multiplexes the first and second lower decoded outputs based on the upper running disparity.

DETAILED DESCRIPTION OF ILLUSTRATIVE EMBODIMENTS

Figure 1:
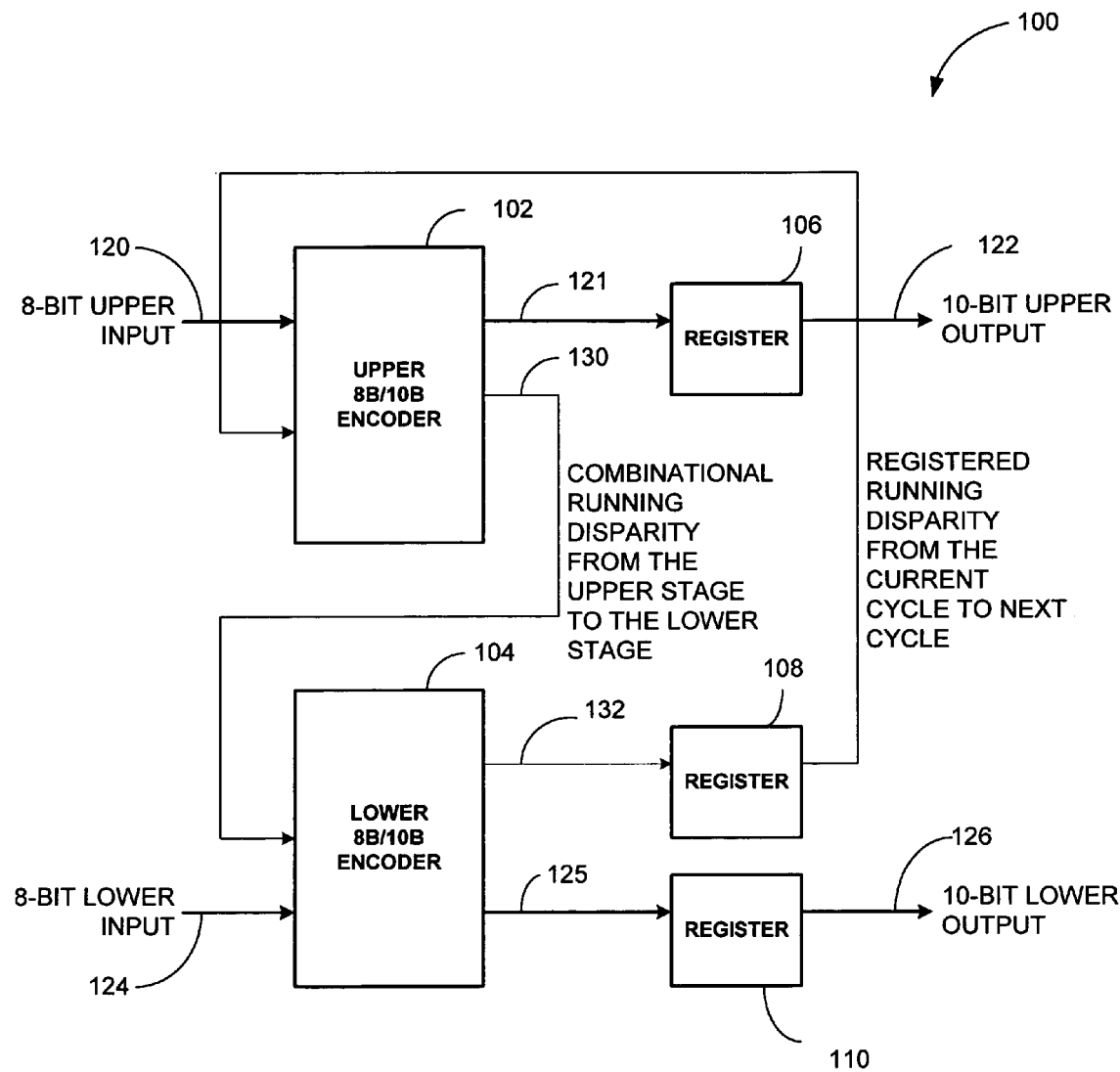
FIG. 1 is a diagram illustrating a 16B/20B encoder according to the prior art.

FIG. 1 is a block diagram illustrating a 16B/20B encoder according to the prior art. One example of such a decoder is disclosed in U.S. Pat. No. 5,663,724. Encoder 100 includes an upper 8B/10B encoder 102, a lower 8B/10B encoder 104, and registers 106, 108 and 110. Encoder 100 receives successive 16-bit user data words and applies a first half of the data word to input 120 and a second half of the data word to input 124. Upper encoder 102 encodes the 8-bit user data word applied to input 120 into a corresponding 10-bit upper code word on output 121, which is captured by register 106. Similarly, lower encoder 104 encodes the 8-bit user data word applied to input 124 into a corresponding 10-bit lower code word on output 125, which is captured by register 110. The captured values in registers 106 and 110 form a 10-bit upper encoded output 122 and a 10-bit lower encoded output 126, which are concatenated together to form a combined 20-bit encoded output block for the received 16-bit user data word.

With this arrangement, encoders 102 and 104 are coupled in parallel with one another. As described in U.S. Pat. No. 5,663,724, each of the encoders 102 and 104 employs an 8B/10B encoding scheme. The upper 8-bit user data word or "block" is partitioned into an upper 5-bit sub-block and an upper 3-bit sub-block, which are applied to user data input 120. The lower 8-bit block is divided into a lower 5-bit sub-block and a lower 3-bit sub-block, which are applied to user data input 124. During a single clock cycle, a first, upper 5B/6B encoder portion in upper encoder 102 encodes the upper 5-bit sub-block to produce an upper 6-bit sub-block, and a first, upper 3B/4B encoder portion of upper encoder 102 encodes the upper 3-bit sub-block to produce an upper 4-bit sub-block. During the same clock cycle in lower encoder 104, a second, lower 5B/6B encoder portion encodes the lower 5-bit sub-block to produce a lower 6-bit sub-block, an a second, lower 3B/4B encoder portion encodes the lower 3-bit sub-block to produce a lower 4-bit sub-block. The upper 6-bit and 4-bit sub-blocks together form the upper 10-bit code word output, and the lower 6-bit and 4-bit sub-blocks together form the lower 10-bit code word output.

The upper and lower 8B/10B encoders 102 and 104 are designed to ensure that bits in the encoded output transition regularly to make it easier to recover the data from a high-speed serial stream by recognizing bit transitions. One of the constraints applied to the bit patterns in the encoded output blocks is a running disparity constraint. A running disparity is a count of the number of binary "1's" or "0's"

in the data. If there are more 0's than 1's, the running disparity is negative. If there are more 1's than 0's, the running disparity is positive. Each encoder 102 and 104 keeps track of the running disparity in potential code words and uses this information to determine which code words to select for the encoded output block in order to produce the required bit transitions.

During a current clock cycle, the upper 8B/10B encoder 102 calculates a running disparity of the current 6-bit and 4-bit encoded sub-blocks. The 3B/4B encoder portion of the upper 8B/10B encoder 102 is responsive to the disparity of the current upper 4-bit encoded sub-block and to the running disparity of the current upper 6-bit sub-block to selectively complement the current upper 4-bit sub-block to reduce the running disparity. The lower 8B/10B encoder 104 calculates a running disparity of the current lower 6-bit and 4-bit encoded sub-blocks. The 5B/6B encoder portion of the lower 8B/10B encoder 104 is responsive to the disparity of the current lower 6-bit sub-block and to the running disparity of the current upper 4-bit sub-block (represented by the state of running disparity output 130) to selectively complement the current lower 6-bit sub-block to reduce running disparity. The 3B/4B encoder portion of the lower 8B/10B encoder 104 is responsive to the disparity of the current lower 4-bit sub-block and to the running disparity of the current 6-bit sub-block to selectively complement the current lower 4-bit sub-block to reduce the running disparity. The upper 5B/6B encoder portion of the upper 8B/10B encoder 102 is responsive to the disparity of the current upper 6-bit sub-block and to the running disparity of the prior lower 4-bit sub-block (calculated in the preceding clock cycle and stored in register 108) to selectively complement the current upper 6-bit sub-block to reduce running disparity. The running disparity of the current lower 4-bit sub-block is then stored in register 108 for the next user data block that will be encoded during the next clock cycle.

The running disparities of the upper 6-bit sub-block, the upper 4-bit sub-block and the lower 6-bit sub-block are combinationally passed successively through the stages in upper and lower encoders 102 and 104, and between the encoders. The running disparity 130 from upper encoder 102 is therefore required before lower encoder 104 can evaluate its 10-bit output 125. The combinational path for the running disparity from upper encoder 102 to lower encoder 104 is therefore becoming increasingly more difficult to evaluate in a single clock cycle as serial interface speeds continually increase with the semiconductor technologies available today.

The conventional approach of widening encoder 100 from a 16B/20B encoder to a 32B/40B encoder allows an increase in the number of bits that can be encoded in parallel but does not solve the problem. There still exists a serial path from the uppermost 8B/10B encoder through the middle 8B/10B encoders to the lowermost 8B/10B encoder.

Figure 2:
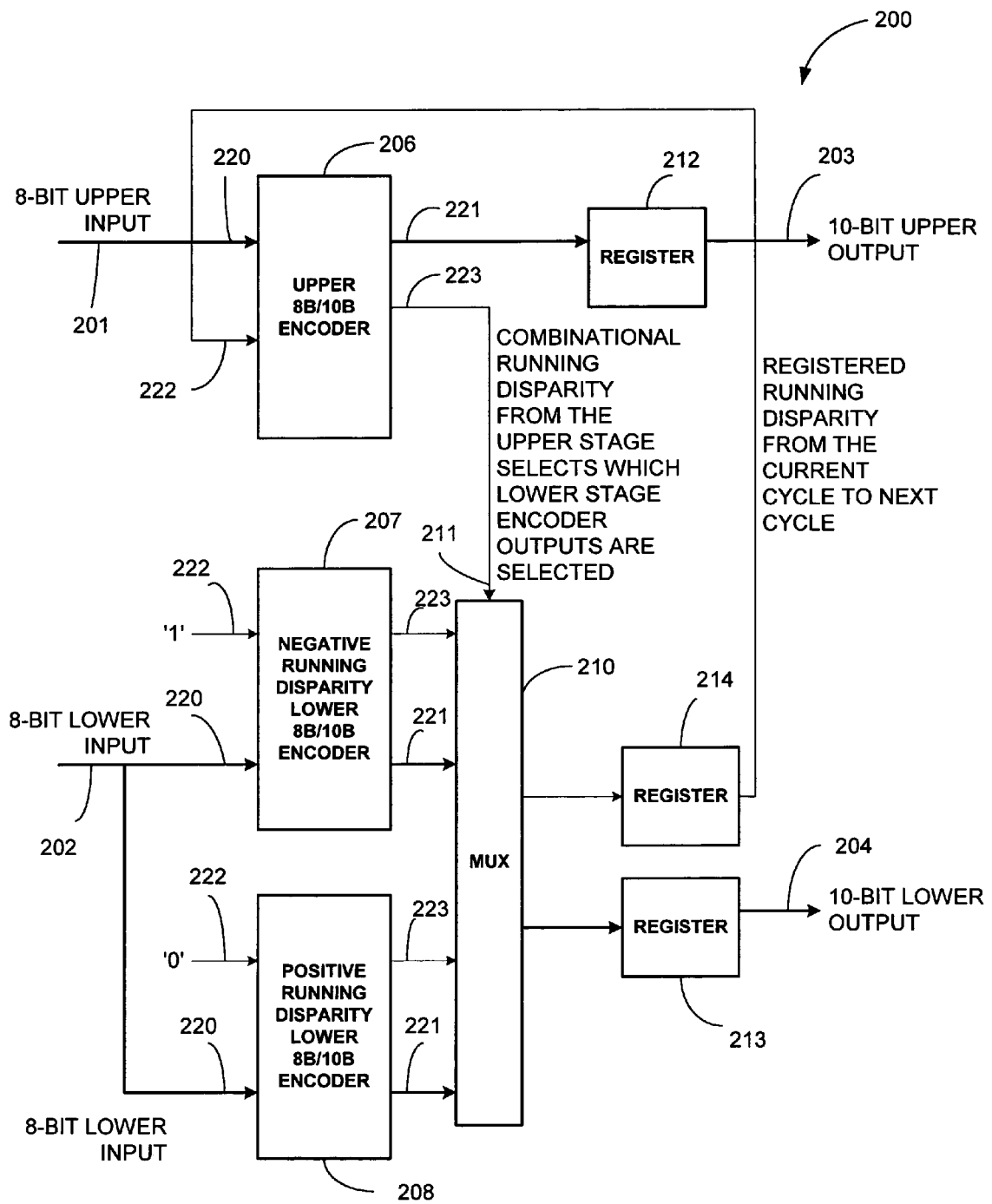
FIG. 2 is a diagram illustrating a 16B/20B encoder according to one embodiment of the present invention.

FIG. 2 is a block diagram illustrating an encoder 200 according to one embodiment of the present invention. While this embodiment is described within the context of an 8B/10B encoding scheme, other embodiments of the present invention can be implemented with other encoding schemes and any desired coding rules. Each encoder can include one or more sub-encoders for encoding respective blocks of input data user words, and each input or output block can have any number of bits. Also, any number of encoders can be coupled in parallel with one another to increase the bandwidth of the overall encoding apparatus.

In the example shown in FIG. 2, encoder 200 includes an 8-bit upper user data input 201, an 8-bit lower user data input 202, a 10-bit upper encoded output 203, and a 10-bit lower encoded output 204. Encoder 200 further includes an upper encoder 206, a first lower encoder 207, a second lower encoder 208, a multiplexer 210, and registers 212–213. In one embodiment, each encoder 206, 207 and 208 includes an 8B/10B encoder as described in U.S. Pat. No. 5,663,724. However, any other type of encoder with any desired coding rules can be used in alternative embodiments.

Each encoder 206, 207 and 208 includes a user data input 220, an encoded data output 221, a running disparity input 222 and a running disparity output 223. The data input of 220 of upper encoder 206 is coupled to the upper 8-bit user data input 201. Encoded output 221 is coupled to the input of register 212, which has an output coupled to upper 10-bit output 203. The running disparity input 222 of upper encoder 206 is coupled to the output register 214 for receiving the running disparity of the lower 10-bit output from the previous clock cycle. The running disparity output 223 of upper encoder 206 is coupled to the select input 211 of multiplexer 210.

Lower encoders 207 and 208 are coupled in parallel with one another with their outputs being multiplexed by multiplexer 210 as a function of the state of the running disparity on output 223 of upper encoder 206. The first lower encoder 207 is a "negative running disparity" encoder having it's data input coupled to the lower 8-bit user data input 202 and its running disparity input 222 coupled to a logic high ("1") state. In this example, a logic high state indicates a negative disparity. The encoded output 221 and the running disparity output 223 of the first lower encoder 207 are coupled to respective data inputs of multiplexer 210.

The second, lower encoder 208 is a "positive running disparity" encoder having it's data input coupled to the lower 8-bit user data input 202 and its running disparity input 222 coupled to a logic low ("0") state. The encoded output 221 and the running disparity output 223 of the second, lower encoder 208 are coupled to respective data inputs of multiplexer 210.

With the arrangement shown in FIG. 2, the encoded outputs 221 of the upper and lower encoders 206, 207 and 208 can be evaluated in parallel instead of in serial as is currently done in the prior art. The first, lower encoder 207 calculates the corresponding encoded data word on output 221 for the current user data word received on input 202 assuming that the running disparity from upper encoder 206 is negative. The second, lower encoder 208 calculates the corresponding encoded data word on output 221 for the current user data word received on input 202 assuming that the running disparity from upper encoder 206 is positive. Multiplexer 210 selects the encoded data output 221 and the running disparity output 223 from the appropriate lower encoder 207 or 208 once the value of the running disparity from upper encoder 206 is available. The respective values are captured in registers 213 and 214. The captured lower encoded data word is applied to the 10-bit lower output 204. The upper 10-bit output 203 and the lower 10-bit output 204 together form a 20-bit code word output. The running disparity value captured in register 214 is then fed back to input 222 of upper encoder 206 for evaluation with the next user data word during the next clock cycle.

The delay through encoder 200 is reduced by almost half relative to the arrangement shown in FIG. 1 since the code words generated by the lower encoders 207 and 208 are generated in parallel with the code word generated by upper encoder 206. This allows encoder 200 to operate at almost two times the interface speed as compared to the encoder shown in FIG. 1.

As mentioned above, the encoder shown in FIG. 2 can be modified to encode any number of user data bits into any suitable number of code bits in blocks or sub-blocks in alternative embodiments of the present invention. Also, the encoder can be scaled for a larger bandwidth. For example, a 32B/40B encoder can be constructed with one upper 8B/10B encoder stage and three lower stages, with each lower state having a lower "negative running disparity" encoder 207, a lower "positive running disparity" encoder 208 and a corresponding multiplexer 210. While this approach is more costly in terms of gate count, the approach would allow the interface speed to be increase by three times (3×) to four times (4×).

In addition, the running disparities within each encoder 206–208 can be calculated on a block basis or sub-block basis. The state on each running disparity output 223 can represent the disparity of all the bits on corresponding encoded output 221 or of any sub-block of those bits. In any case, each encoder 206–208 generates a respective running disparity output 223 representing a disparity in the symbols or bits of a block or sub-block in the current encoded output. In one embodiment, the state on each running disparity output 223 represents the disparity of the 4-bit coded output block produced by the lower 3B/4B portion of the encoder, as described in U.S. Pat. No. 5,663,724.

Figure 3:
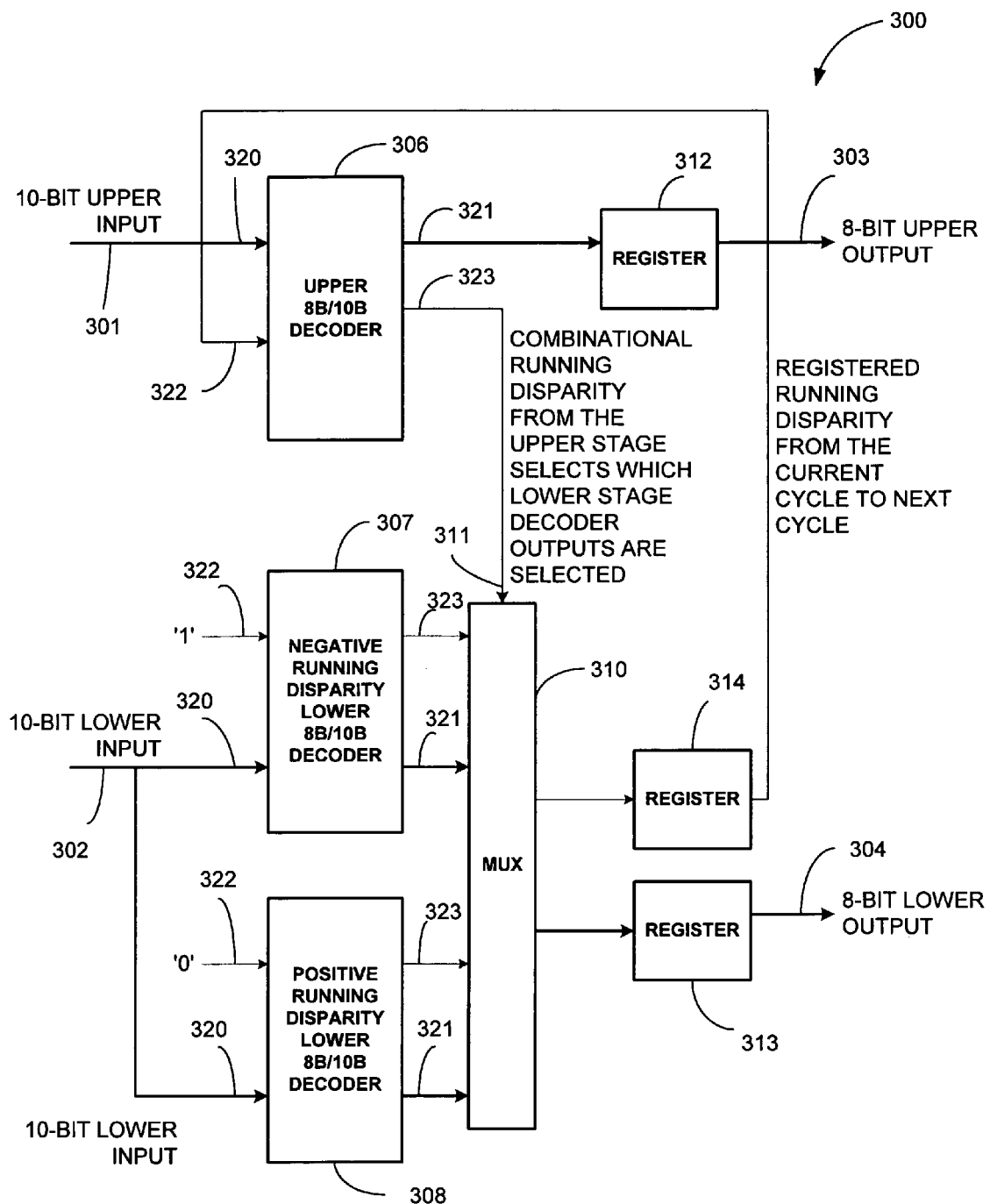
FIG. 3 is a diagram illustrating a 16B/20B decoder according to one embodiment of the present invention.

FIG. 3 is a block diagram illustrating a decoder 300 according to one embodiment of the present invention. Decoder 300 decodes 20-bit code words into corresponding 16-bit user data word with a process that is essentially the reverse of that described with reference to FIG. 2. Each 20-bit code word is divided into a 10-bit upper input 301 and a 10-bit lower input 302. The 10-bit upper input 301 is decoded into a corresponding 8-bit upper user data word on output 303, and the 10-bit lower input 302 is decoded into a corresponding 8-bit lower user data word on output 304.

Decoder 300 includes upper decoder 306, a "negative running disparity" lower decoder 307, a "positive running disparity" lower decoder 308, a multiplexer 310 and registers 312–314. In this example, each decoder 306–308 includes an 8B/10B decoder that applies the inverse of the coding rules applied by encoders 206–208 described in reference with FIG. 2. However, other types of decoders can be used in alternative embodiments of the present invention. Each decoder 306–308 includes a 10-bit code word input 320, an 8-bit user data word output 321, a running disparity input 322 and a running disparity output 323. The running disparity input 322 of upper decoder of 306 is coupled to the output of register 314 for receiving the running disparity from the corresponding lower decoder 307 or 308 from the previous clock cycle. For the current code word, upper decoder 306 calculates the running disparity of the upper 10-bit code word (or the lower 4-bit sub-block of the code word) and applies the disparity value to select input 311 of multiplexer 310.

The running disparity input 322 of lower decoder 307 is coupled to a logic high ("1") state, and the running disparity input 322 of lower decoder 308 is coupled to a logic low ("0") state. Lower decoder 307 therefore decodes the lower 10-bit code word received on input 320 into a corresponding user data word on output 321 assuming that the running disparity from upper decoder 306 is negative. Lower decoder 308 decodes the lower 10-bit code word received on input 320 into a corresponding user data word on output 321 assuming the running disparity from upper decoder 306 is positive. Each lower decoder 307 and 308 calculates a corresponding running disparity for the lower 10-bit code word (or a sub-block of the code word) and applies the disparity value to the respective output 323.

Depending on whether the running disparity from upper decoder 306 is negative or positive, multiplexer 310 selects the decoded user data word and running disparity value from the corresponding lower decoder 307 or 308. The selected values are captured in registers 313 and 314. Similar to encoder 200, decoder 300 can be expanded to achieve wider bandwidth by adding additional lower stages, with each lower stage having a negative and positive running disparity decoder and corresponding multiplexer.

Although the present invention has been described with reference to preferred embodiments, workers skilled in the art will recognize that changes may be made in form and detail without departing from the spirit and scope of the invention.

What is claimed is:

1. An encoder apparatus comprising:
    an upper encoder comprising an upper encoded output and a corresponding upper running disparity;
    first and second lower encoders comprising respective first and second lower encoded outputs, wherein the first lower encoder generates the first lower encoded output assuming the upper running disparity has a first state and the second lower encoder generates the second lower encoded output assuming the upper running disparity has a second, different state; and
    a multiplexer, which multiplexes the first and second lower encoded outputs based on the upper running disparity.

2. The encoder apparatus of claim 1 wherein:
    the upper and lower encoders generate the upper and lower encoded outputs relative to clock cycles; and
    the lower encoders generate the first and second lower encoded outputs in a same clock cycle as the upper encoder generates the upper encoded output.

3. The encoder apparatus of claim 2 wherein:
    the first and second lower encoders generate respective first and second lower running disparities with the first and second lower encoded outputs;
    the multiplexer multiplexes the first and second lower running disparities based on the upper running disparity to produced a multiplexed lower running disparity; and
    the upper encoder generates the upper encoded output during a present clock cycle based on the multiplexed running disparity of a next previous clock cycle.

4. The encoder apparatus of claim 1 wherein implements a 16B/20B code from an input data stream that includes consecutive 16-bit data blocks, and wherein each of the upper and lower encoders comprises an 8B/10B encoder having a 5B/6B and a 3B/4B encoder portion responsive to respective 5-bit and 3-bit sub-blocks to produce respective 6-bit and 4-bit output sub-blocks.

5. The encoder apparatus of claim 1 and further comprising:
    further sets of the first and second lower encoders, wherein the first and second lower encoders of each further set comprise respective first and second lower encoded outputs, wherein the first lower encoder generates a respective first lower encoded output assuming the running disparity from an encoder in a previous set has a first state and the second lower encoder generates a respective second lower encoded output assuming the running disparity from the encoder in the previous set has a second, different state.

6. A method of encoding an input data stream, the method comprising:

(a) dividing a portion of the input data stream into first and second blocks;
(b) encoding the first block into an upper encoded block and generating a corresponding upper running disparity;
(c) encoding the second block into a first lower encoded block assuming the upper running disparity has a first state;
(d) encoding the second block into a second lower encoded block, in parallel with step (c), assuming the upper running disparity has a second, different state; and
(e) multiplexing the first and second lower encoded outputs based on the upper running disparity.

7. The method of claim 6 wherein:
step (b) comprises encoding the first block into an upper encoded block in a present clock cycle; and
steps (c) and (d) comprise encoding the second block into first and second lower encoded blocks in the same, present clock cycle.

8. The encoder apparatus of claim 7 wherein:
steps (c) and (d) comprise generating respective first and second lower running disparities with the first and second lower encoded blocks;
step (e) comprises multiplexing the first and second lower running disparities based on the upper running disparity to produced a multiplexed lower running disparity; and
step (b) comprises encoding the first block into an upper encoded block during a present clock cycle based on the multiplexed running disparity of a next previous clock cycle.

9. The method of claim 6, wherein the method implements a 16B/20B code from the input data stream and wherein:
step (a) comprises receiving consecutive 16-bit blocks from the input data stream and dividing each 16-bit block into consecutive first and second 8-bit blocks; and
steps (b) through (d) each comprises encoding respective 5-bit and 3-bit sub-blocks of the respective 8-bit blocks to produce respective 6-bit and 4-bit output sub-blocks.

10. The method of claim 6, wherein the method further comprises:
(f) dividing a further portion of the input data stream into at least one further block;
(g) for each further block, encoding the further block into a further, first lower encoded block assuming a running disparity from another of the encoded blocks has the first state;
(h) for each further block encoding the further block into a further, second lower encoded block, in parallel with step (g), assuming the running disparity from the other of the encoded blocks has the second, different state; and
(i) multiplexing the further, first and second lower encoded outputs based on the running disparity from the other of the encoded blocks.

11. A decoder apparatus comprising:
an upper decoder comprising an upper decoded output and a corresponding upper running disparity;
first and second lower decoders comprising respective first and second lower decoded outputs, wherein the first lower decoder generates the first lower decoded output assuming the upper running disparity has a first state and the second lower decoder generates the second lower decoded output assuming the upper running disparity has a second, different state; and
a multiplexer, which multiplexes the first and second lower decoded outputs based on the upper running disparity.

12. The decoder apparatus of claim 11 wherein:
the upper and lower decoders generate the upper and lower decoded outputs relative to clock cycles; and
the lower decoders generate the first and second lower decoded outputs in a same clock cycle as the upper decoder generates the upper decoded output.

13. The decoder apparatus of claim 12 wherein:
the first and second lower decoders generate respective first and second lower running disparities with the first and second lower decoded outputs;
the multiplexer multiplexes the first and second lower running disparities based on the upper running disparity to produced a multiplexed lower running disparity; and
the upper decoder generates the upper decoded output during a present clock cycle based on the multiplexed running disparity of a next previous clock cycle.

14. The decoder apparatus of claim 11 wherein implements a 16B/20B code from an encoded data stream that includes consecutive 20-bit data blocks, and wherein each of the upper and lower decoders comprises an 8B/10B decoder having a 5B/6B and a 3B/4B decoder portion responsive to respective 6-bit and 4-bit encoded sub-blocks to produce respective 5-bit and 3-bit decoded output sub-blocks.

15. The decoder apparatus of claim 11 and further comprising:
further sets of the first and second lower decoders, wherein the first and second lower decoders of each further set comprise respective first and second lower decoded outputs, wherein the first lower decoder generates a respective first lower decoded output assuming the running disparity from a decoder in a previous set has the first state and the second lower decoder generates a respective second lower decoded output assuming the running disparity from the decoder in the previous set has the second, different state.

* * * * *